United States Patent [19]

Stangl et al.

[11] Patent Number: 4,686,162

[45] Date of Patent: Aug. 11, 1987

[54] OPTICALLY STRUCTURED FILTER AND PROCESS FOR ITS PRODUCTION

[75] Inventors: Günther Stangl; Friedrich Rüdenauer, both of Vienna, Austria

[73] Assignee: Osterreichisches Forschungszentrum Seibersdorf GES, mbH, Lenaugasse, Austria

[21] Appl. No.: 667,493

[22] PCT Filed: Feb. 27, 1984

[86] PCT No.: PCT/AT84/00010

§ 371 Date: Oct. 12, 1984

§ 102(e) Date: Oct. 12, 1984

[87] PCT Pub. No.: WO84/03571

PCT Pub. Date: Sep. 13, 1984

[30] Foreign Application Priority Data

Mar. 1, 1983 [AT] Austria ................................. 717/83

[51] Int. Cl.⁴ .............................................. G03F 9/00
[52] U.S. Cl. ..................................... 430/5; 430/321; 427/38; 250/492.3
[58] Field of Search ...................... 430/5, 321; 427/38; 250/492.1, 492.3

[56] References Cited

U.S. PATENT DOCUMENTS

| | | |
|---|---|---|
| 3,682,729 | 8/1972 | Gukelberger et al. |
| 3,940,507 | 2/1976 | Fech et al. ........................ 427/43.1 |
| 4,144,066 | 3/1979 | Ernsberger . |
| 4,548,883 | 10/1985 | Wagner ................................ 430/5 |

FOREIGN PATENT DOCUMENTS

| | | | |
|---|---|---|---|
| 55-73047 | 6/1980 | Japan ................................ | 430/5 |
| 56-19623 | 2/1981 | Japan ................................ | 430/5 |
| 57-102019 | 6/1982 | Japan ................................ | 430/5 |
| 57-157248 | 9/1982 | Japan . | |
| 58-93052 | 6/1983 | Japan ................................ | 430/5 |
| 1577479 | 10/1980 | United Kingdom . | |
| 1583459 | 1/1981 | United Kingdom . | |
| 2079536 | 1/1982 | United Kingdom . | |

OTHER PUBLICATIONS

Hashimoto et al, "A New Photomask With Ion-Implanted Resist", IC Division Nippon Electric Co. Ltd., pp. 198-201.
Seliger et al, "Ion Beams Promise Practical Systems for Submicrometer Wafer Lithography", Electronics, 3/27/80, pp. 142-146.
Chemical Abstracts, vol. 98, No. 18, published 5/2/83, p. 543, Nr. 152099a, Columbus, Ohio, USA; A. L. Kamardin et al.; "Charge in Optical Properties of Thin Films as a Result of Ion Bombardment" & Poverkhnost 1982, (4), 87-89.
Patents Abstracts of Japan, vol. 6, Nr. 262(P-164) (1140), 12/21/82 & Japanese Patent Publication 57-156 248 (Nippon Denki K.K.) 9/28/82.
Patents Abstracts of Japan, vol. 6, Nr. 129(P-128) (1007), 7/15/82 & Japanese Patent Publication 57-54939 (Matsushita Denki Sangyo K.K.) 4/1/82.
Patents Abstracts of Japan, vol. 6, Nr. 104(P-122) (982), Jun. 1982 & Japanese Patent Publication 57-35859 (Tokyo Shibaura Denki Sangyo K.K.) 2/26/1982.
Patents Abstracts of Japan, vol. 7, Nr. 196(P-219) (1341), 8/26/83 & Japanese Patent Publication 58-93052 (Suwa Seikosha K.K.) 6/3/83.
Journal of Vacuum Science & Technology, vol. 16, No. 6, pp. 1897 to 1900, Nov./Dec. 1979.
Electronics, Mar. 27, 1980, pp. 142, 146.

*Primary Examiner*—John E. Kittle
*Assistant Examiner*—José G. Dees
*Attorney, Agent, or Firm*—Werner W. Kleeman

[57] ABSTRACT

The invention relates to an optically structured filter with predominantly smooth or planar surfaces. Such filters are used as primary masks for the photolithographically manufacturing microelectronic elements, having with at least one pattern with a different transmission in relation to an electromagnetic radiation to be filtered. A filter layer consists of a material of locally homogeneous transmission into which ions, preferably metal ions with an energy of more than 1 keV, are implanted for producing the pattern(s) with the different transmission. This makes it possible to produce filters having patterns with regions of different transmissions for various wave lengths. Suitable materials to be used for the filter layer are materials such as inorganic and organic polymers and glasses as well as mono- and polycrystalline oxides or nitrides. The ion implantation itself is carried out by means of process steps known per se.

6 Claims, 4 Drawing Figures

OPTICALLY STRUCTURED FILTER AND PROCESS FOR ITS PRODUCTION

BACKGROUND OF THE INVENTION

The present invention relates to a new and improved method of manufacturing an optically structured filter and to a new and improved optically structured filter.

In its more particular aspects, the present invention relates specifically to a new and improved method of manufacturing an optically structured filter with essentially smooth surface, in particular to a photolithographic mask for production of microelectronic devices, and which filter comprises at least one pattern with differing transmission for the electromagnetic radiation to be filtered.

The known methods of manufacturing optically structured filters for electromagnetic radiation, in particular such filters or photolithographic masks for the production of microelectronic devices, all require a number of method steps which include wet chemical developing procedures as well as etching steps and/or reactive ion etching or "ion milling".

In one known method, a metal or metal oxide layer with a thickness of 80-140 nm and, opaque to the required wavelength—range of radiation is provided on a supporting material, in particular on synthetic quartz glass. On top of this layer a photoresist layer with a thickness of at least 300 nm is deposited. The photoresist layer is exposed to electromagnetic radiation (UV- or X-rays) or to a particle beam (electrons, ions), according to a predetermined pattern. This exposure to radiation induces local changes in (wet chemical) etching rate; in the case of a photoresist type known as "positive" photoresist, the previously exposed areas are preferentially removed by the etching process and the underlying optically opaque layer is accessible to a further etching step. During this second etching step the optically opaque layer is locally removed so that in a final, third etching step (reactive plasma etching or wet chemical etching of the photoresist) in which the remaining not exposed sections of the photoresist layer are removed, a working mask is finally formed and consists of a pattern of optically opaque material on an optically transparent supporting layer.

According to a relatively new process (J. Electrochem. Soc. 129, p. 827–830, 1982; B. A. MacIver), a transparent layer of a positive photoresist is deposited on a transparent supporting quartz layer. The photoresist layer is exposed to UV or electron irradiation according to a predetermined pattern. In a wet chemical developing step the exposed areas of the photoresist are etched away throughout up to the transparent supporting material. In a further step the remaining, previously not exposed, photoresist areas are transformed into a highly opaque state particularly for UV—radiation by implantation of silicon ions so that a working mask consisting of optically opaque material on top of a transparent supporting layer and to the original exposure pattern, is finally formed.

All of the manufacturing methods described so far can be classified as "lithographic processes" in which the chemical behaviour of a layer of photoresist is locally changed by different exposure processes (UV, X ray, electron, ion irradiation). These methods also require one or more wet or plasma chemical etching steps.

Apart from the number of required processing steps, these chemical etching steps are connected with a number of disadvantages: During wet chemical etching methods, "under-etching", i.e. lateral broadening of the etching action under the structured photoresist protecting from the etching fluid is relatively extensive which limits the obtainable width of structurizations to about 600–700 nm. Plasma—chemical etching methods are largely free from such under-etching, however, may cause optical diffraction effects when using the mask in photolithography due to a not completely avoidable attack on the surface of the transparent supporting layer.

A further disadvantage of the manufacturing methods described hereinabove is the fact that the finished filters or working masks do not have smooth surfaces. In fact, the surface of the optically opaque layer has recesses of a depth equal to the layer thickness in the regions corresponding to the original exposure pattern. In contrast to a filter or mask with a smooth surface, there is thus increased in a filter or mask produced according to the aforementioned hitherto known methods, the danger of contamination by small dust particles which are trapped in the recesses and which can be removed only with great difficulty. This leads to a decrease of process efficiency in the production of microelectronic circuits.

SUMMARY OF THE INVENTION

Therefore, with the foregoing in mind, it is a primary object of the present invention to provide a new and improved method of manufacturing an optically structured filter and which method is not afflicted with the aforementioned drawbacks and limitations of the prior art methods heretofore discussed.

Another and more specific object of the present invention is directed to the provision of a new and improved method of manufacturing an optically structured filter and which method enables the manufacture of working masks, preferably with pattern widths below 1 micrometer.

Another important object of the present invention is directed to the provision of a new and improved method of manufacturing an optically structured filter and which method requires a smaller number of method steps, particularly of wet or plasma chemical etching steps with their inherent disadvantages, and thus is considerably simplified.

Another significant object of the present invention is directed to the provision of a new and improved method of manufacturing an optically structured filter having an essentially smooth, unstructured surface whereby the risk of contamination of the filter is considerably reduced.

Now in order to implement these and still further objects of the invention, which will become more readily apparent as the description proceeds, the method of the present development is manifested by the features that, ions, particularly metal ions with an energy in excess of 1 keV, are implanted in the filter layer in order to form the pattern(s) or area(s) of different transmission; the filter layer originally exhibits locally homogeneous transmission for the electromagnetic radiation to be filtered and the implantation is selectively carried out in the pattern configuration(s) to be produced.

In this manner it is possible to considerably simplify the manufacturing method and in particular to avoid the etching step which is difficult to control in the manufacture of structured filters. Essentially, the novel and inventive manufacturing method for producing the optical structure as such requires only one single step.

During the ion implantation ions penetrate according to their kinetic energy into the filter layer wherein they remain stationary. By suitably selecting the species and/or energy and/or dose of the implanted ions the particular required transmission characteristics of the filter layer are obtained. In those regions, where the ions are implanted into the filter layer, the transmission for electromagnetic radiation of a particular wavelength or wavelength region is modified.

Due to the short range of scattered ions in solid materials (few 10s of nanometers), the inventive method has the further advantage that the implanted ions remain localized in the immediate vicinity of their point of incidence. Consequently, practically no scattering-induced broadening of the optical structures produced in the filter layer is observed in contrast to e.g. electron beam lithography, where secondary electrons are produced during the penetration of a focused electron beam into the photoresist layer and broaden the spatial structures of the filter or mask. Due to the reduced scattering of ions in solids, the inventive method permits the manufacture of structural optical filters or masks for optical lithography with presently useful linewidths down to 200 nm.

In this connection it is of advantage to write the pattern using a focused metal ion beam which is guided or positioned by electromagnetic deflection. In presently available systems the beam emitted by a liquid metal field emission ion source can be focused to a diameter of 40 nm. Structures with a linewidth of approximately 50 nm can easily be produced by means of such a beam.

A further advantage of the inventive method is the fact that by variation of the implantation parameters e.g. by variation of ion dose and/or ion energy, areas or patterns of different transmissions for electromagnetic radiation of different wavelengths can be produced. A further possibility for variation of implantation parameters is implanting ions of different elements, molecular ions or multiply charged ions.

As alluded to above, the invention is not only concerned with the aforementioned method aspects, but also relates to a novel optically structured filter. Generally speaking, the inventive optically structured filter which particularly constitutes a working mask for photolithographically manufacturing microelectronic components, comprises predominantly smooth surfaces and at least one region or pattern with different transmission for an electromagnetic radiation to be filtered by the optically structured filter.

To achieve the aforementioned measures, the inventive optically structured filter, in its more specific aspects, comprises:

patterns or regions of altered transmission due to ion implantation and formed in the filter layer having locally homogeneous transmission for the electromagnetic radiation to be filtered.

The filter layer consists of materials which are sufficiently transparent for the radiation to be filtered and which, upon ion implantation, exhibit sufficient change in transmission.

Advantageously different ions are used for different filter materials.

Particularly useful are substances which can be easily produced as thin homogeneous films, such as organic or inorganic polymers e.g. polymethyl methacrylate, silicones, organic and inorganic glasses, e.g. acrylic glass, synthetic quartz. Also suitable are mono- and polycrystalline substances, in particular oxides and nitrides e.g. silicon dioxide, sapphire, silicon nitride. For filters filtering low energy X-rays, metals with low atomic number are suitable candidates as filter layer material.

A particular advantage of the new process is the fact that thin masks can be produced which can adapt to the shape of the surface to be structured by the photolithographic process. With such masks lithographic processes can be performed on nonplanar surfaces.

In order to increase the mechanical rigidity of the filters or masks produced according to the inventive method, the filter layer can be deposited on a transparent supporting layer; for wavelengths below 400 nm synthetic quartz can be used as such supporting material.

A particularly useful embodiment of the filters or masks manufactured according to the inventive process, contains a filter layer having a maximum thickness of 400 nm, preferably between 100 and 200 nm, which filter layer is deposited on a supporting layer, e.g. synthetic quartz glass. Such filters or masks are suitable for UV and deep UV wavelengths.

In order to obtain a particularly high edge sharpness of the patterns to be implanted, it may be necessary to maintain the surface of the filter layer at a constant electrostatic potential during implantation. If the filter layer itself is not sufficiently conductive, a thin conductive layer, preferably a gold layer having a thickness between 3 and 20 nm, can be deposited upon the filter layer prior to the implantation process. It can be of advantage to remove this conducting layer after the implantation process.

BRIEF DESCRIPTION OF THE DRAWINGS

The invention will be better understood and objects other than those set forth above, will become apparent when consideration is given to the following detailed description thereof. Such description makes reference to the annexed drawings wherein throughout the various figures of the drawings there have been generally used the same reference characters to denote the same or analogous components and wherein.

DETAILED DESCRIPTION OF THE PREFERRED EMBODIMENTS

Describing now the drawings, it is to be understood that only enough of the optically structured filter and the method of manufacturing the same has been shown for those skilled in the art to readily understand the underlying principles and concepts of the present development, while simplifying the showing of the drawings.

Figure 1:
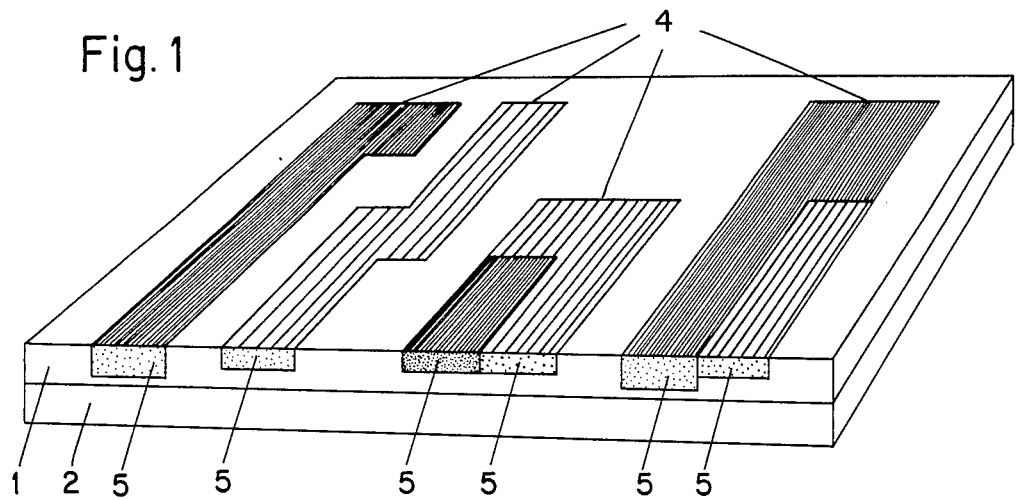
FIG. 1 is a schematic and perspective, partially sectional view of an exemplary embodiment of the optically structured filter according to the invention.

Turning attention now specifically to FIG. 1 of the drawings, there is shown in a schematic and perspective, partially sectional view the type of structure which is present in the inventive optically structured filter.

The exemplary embodiment illustrated in FIG. 1 contains a supporting layer 2 of synthetic quartz glass and a supported filter layer 1 of an organic polymer like, for example, polymethyl methacrylate.

There are recognized in FIG. 1 four patterns 4 consisting of regions 5 with mutually different transmissions. In the left-hand part of the filter or mask two different patterns 4 with mutually different transmissions are shown and the transmission is locally homogeneous in each one of the patterns 4. In the cross-sectional view the different implantation depths of these patterns are indicated. In the right-hand part of the filter or mask two further patterns 4 can be seen, each of which comprises two separate areas 5 with different transmissions. The areas 5 of different transmissions are produced using different implanted ion species, implantation depths and concentrations of implanted particles; these differences are obtained by variations in the implantation parameters e.g. ion species, ion energy and ion dose.

Figure 2:
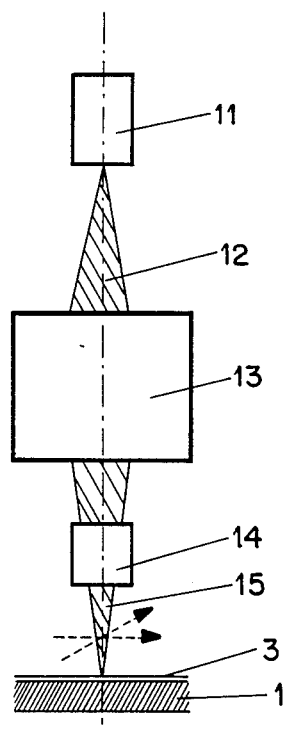
FIG. 2 is a schematic illustration of an apparatus for carrying out a first embodiment of the inventive method of manufacturing an optically structured filter of the type as shown in FIG. 1.
Figure 3:
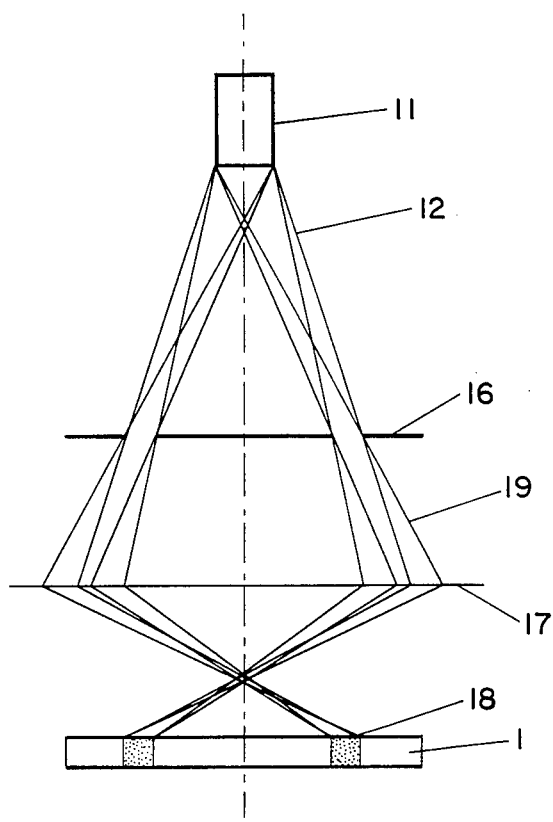
FIG. 3 is a schematic illustration of an apparatus for carrying out a second embodiment of the inventive method of manufacturing an optically structured filter of the type as shown in FIG. 1.

As schematically illustrated in FIG. 2, the inventive method of ion implantation can be performed using known techniques. In the first embodiment of the inventive method here shown, an ion beam 12 is extracted from an ion source 11 and focused by an ion lens 13 or a combination of such ion lenses 13 to a diameter which is smaller than the narrowest desired structural width of those areas 5 of the filter or mask and which are intended to have different transmissions for electromagnetic radiation. Using also well known electric or magnetic deflection means 14, this finely focused ion beam 15 is deflected in such a manner across the filter layer 1 that the ion beam 15 implants a pattern into the filter layer 1 which corresponds to the pattern 4 in the filter or lithographic mask to be produced. A very thin conductive layer 3 covers the filter layer 1.

Alternatively, the ion beam may remain stationary and the patterns 4 and areas 5 can be produced by displacing the filter layer 1 below the focused ion beam 15 in such a manner that the ions are again implanted into the filter layer 1 only in a pattern 4 corresponding to the pattern of the filter or lithographic mask to be produced. When the ion source 11 is of the type known as liquid metal field emission ion source, a particularly strong ion current can be focused on areas with very small lateral extension. In this manner, filters or masks with small structural widths can be produced in a particularly short time.

A further, essentially known, possibility for carrying out a second embodiment of the inventive method is schematically illustrated. The implantation of the pattern 4 is thereby performed using an unfocused or weakly focused ion beam 12 which is produced by an ion source 11 and penetrates a primary mask 16 thereby forming fractional ion beams 19. This primary mask 16 is projected by means of an ion optical imaging system 17 as an ion optical image 18 into the filter layer 1 which constitutes the polymer layer. Ion optical imaging allows a desired magnification or reduction of the patterns or areas in the primary mask 16. In this manner the precision of the patterns 4 on the filter or lithographic mask is very high and patterns with small feature widths can be produced.

Figure 4:
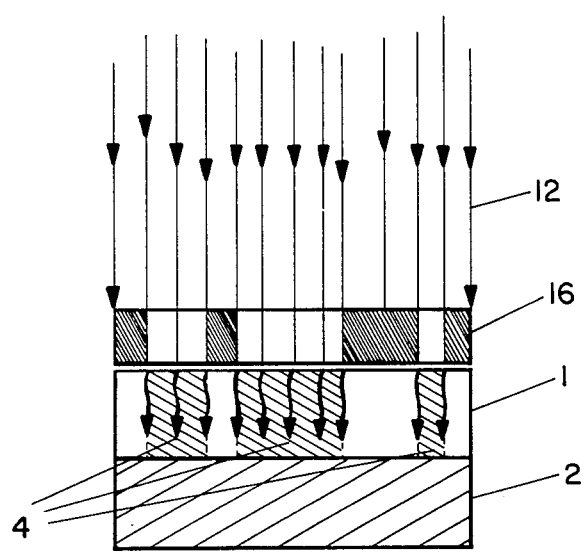
FIG. 4 is a schematic illustration of an apparatus for carrying out a third embodiment of the inventive method of manufacturing an optically structured filter of the type as shown in FIG. 1.

A possibility for carrying out a third embodiment of the inventive method is schematically illustrated in FIG. 4. A primary mask 16 carries, at a 1:1 scale, the pattern which is to be produced in the filter layer 1, and is brought into contact with the filter layer 1. This arrangement is exposed to an unfocused ion beam 12. Also in this case like in the other embodiments described hereinbefore, the filter layer 1 can be supported by means of a supporting layer or substrate 2.

On principle, it has to be stated that filters or masks manufactured according to the inventive method, apart from being useful for the structurization of solid surfaces in the manufacture of microelectronic circuits, also can be used for the manufacture of integrated optics devices, of one- and two dimensional diffraction gratings for electromagnetic radiation and of zone plate lenses.

Specific examples of the second embodiment of the inventive method will now be described hereinafter in detail with reference to FIGS. 1 and 2:

In order to ensure a sufficiently high transmission in the range of the wavelength required for the illumination of the filter or mask, a carrier or supporting layer 2 made from pure synthetic quartz glass is used. On top of the carrier or supporting layer 2 a homogeneous, UV-transparent organic layer or filter layer 1 of polymethyl methacrylate (PMMA) having a thickness of 300 nm is deposited using the well known spinning technique. On top of the filter layer 1 a gold layer 3 having a thickness of approximately 4 nm is deposited by means of the sputtering technique. Alternatively, a self-supporting foil of a polyterephthalic ester having a thickness of 50 micrometers was used as the filter layer 1. In accordance with the second embodiment of the inventive method, the filter or mask is obtained by the aforementioned writing-type application of the ion beam 12 for ion implantation. A liquid metal field ionization ion source 11 is used and from this ion source a beam 12 of indium ions of high brightness value was extracted. Alternatively, tin ions also obtained from a liquid metal field ionization source, and oxygen ions produced by a duoplasmatron as the ion source 11, were used in the implantation step. Also in these cases there are obtained a sufficiently high change in the transmission and an edge sharpness which is equivalent to that obtained by the indium implantation.

The ion beam 12 is accelerated to an energy of about 10 keV and focussed such that a current of 10 nA of singly charged indium, tin or oxygen ions is obtained in a spot of 5 micrometer diameter at the surface of the polymer or filter layer 1. A pattern 4 is written into the filter layer 1 by electrostatic deflection of the ion beam 15 and at a local ion dose of approximately $4 \times 10^{15}$ ions/cm$^2$. Following the ion implantation step, the remaining gold layer 3 was chemically etched away. The usefulness of the ion implanted pattern as a filter ion lithographic mask for UV—irradiation was demonstrated by bringing the implanted polymer or filter layer 1 into contact with a substrate onto which a positive photoresist (Shipley AZ 1350J, 600 nm thickness) was spun. The filter or mask was irradiated by means of a UV radiation source (high pressure mercury lamp) for an exposure time of about 3.5 sec. After development of the photoresist (60 sec spray development at 800 revolutions/sec with AZ 350 developer, dilution 5:1 in deionized water) the filter or mask structure was replicated in the photoresist layer with high edge resolution.

High power UV- and deep UV irradiation- illumination sources like, for example, excimer lasers are presently intended to be used for the production of microelectronic circuits. A wavelength range between 170 nm and 350 nm is accessible thereby. Filters on lithographic masks produced according to the invention are particularly suited for use with such irradiation sources, as has been shown in tests using an excimer laser. Deep UV- sensitive photoresists (e.g. Shipley AZ 2400 and PBS) could be structurized using ion implanted filters or masks and an unfocused excimer laser as the irradiation source at wavelengths of 193 nm (ArF excimer laser) and 248 nm (KrF excimer laser). The filters or masks obtained by employing the inventive method proved to be improved over standard chromium-chromium oxide filters or masks, with respect to service life because as in the last mentioned chromium-chromium oxide filters or masks the metal layer is destroyed by the high power density of the excimer—laser radiation (5 megawatt/cm$^2$) in a relatively short time.

The inventive method also permits the manufacture of very thin filters or masks which readily adapt to the shape of nonplanar surfaces and which can be obtained by implanting ions into a thin (e.g. up to 20 micrometer thickness), transparent, self-supporting foil constituting the filter layer 1. Such filters or masks permit the structurization of nonplanar surfaces using contact-lithographic techniques. With such filters or masks it is easily possible to obtain complete contact between the filter or mask and the photoresist coated substrate which is impossible using presently available filter or mask materials. Using the inventive filters or masks, contact litography could be carried out on cylindrical surfaces with radii of curvature smaller than 2 mm.

While there are shown and described present preferred embodiments of the invention, it is to be distinctly understood that the invention is not limited thereto, but may be otherwise variously embodied and practiced within the scope of the following claims. Accordingly,

We claim:

1. A method of manufacturing an optically structured filter for filtering electromagnetic radiation of at least one predetermined wavelength range, said method comprising the steps of:

preparing a substantially homogeneous unstructured filter layer possessing a substantially smooth surface;

forming the optically structured filter possessing the substantially unstructured smooth surface using a substantially one-step operation by exposing said substantially homogeneous unstructured filter layer at said substantially smooth surface in an unprotected condition and in preselected areas thereof to at least one ion beam and thereby implanting ions in said preselected areas of said substantially homogeneous unstructured filter layer and forming a predetermined pattern containing at least one locally homogeneous region which differs with respect to its transmission for said at least one predetermined wavelength range of electromagnetic radiation from a remaining, non-exposed portion of said substantially homogeneous unstructured filter layer;

selecting as said at least one ion beam a practically non-focused ion beam;

preparing a primary mask comprising predetermined sections which are permeable for said practically non-focused ion beam;

arranging said primary mask rearwardly of said substantially homogeneous unstructured filter layer as seen in the direction of said ion beam;

said step of exposing said substantially homogeneous unstructured filter layer entails irradiating such filter layer through said primary mask in order to thereby implant ions in said preselected areas of said substantially homogeneous unstructured filter layer and to form said predetermined pattern containing said at least one locally homogeneous region of different transmission;

arranging an ion optical imaging system between said primary mask and said substantially homogeneous unstructured filter layer; and during said step of exposing said homogeneous unstructured filter layer, imaging said primary mask by means of said ion optical imaging system upon said substantially homogenous unstructured filter layer.

2. The method as defined in claim 1, further including the steps of:

selecting as said practically non-focused ion beam a weakly focused ion beam.

3. The method as defined in claim 1, further including the steps of:

selecting as said primary mask, a mask of a scale which is larger than that of said predetermined pattern to be formed in said substantially homogeneous unstructured filter layer; and selecting as said ion optical imaging system a demagnifying imaging system.

4. The method as defined in claim 1, further including the step of:

selecting as said at least one ion beam a metal ion beam having an energy in excess of 1 keV.

5. The method as defined in claim 1, further including the steps of:

selecting as said substantially homogeneous unstructured filter layer a filter layer of a glassy material; and selecting as said at least one ion beam an oxygen ion beam.

6. The method as defined in claim 5, wherein:

said step of selecting said glassy material for said substantially homogeneous unstructured filter layer entails the step of selecting a suitable organic polymer.

* * * * *

UNITED STATES PATENT AND TRADEMARK OFFICE
CERTIFICATE OF CORRECTION

PATENT NO. : 4,686,162

DATED : August 11, 1987

INVENTOR(S) : GüNTHER STANGL et al

It is certified that error appears in the above-identified patent and that said Letters Patent is hereby corrected as shown below:

IN THE ABSTRACT OF THE DISCLOSURE

Line 3, please delete "the"

Column 5, line 62, please delete "into" and insert --onto--

Column 7, line 5, please delete "on" and insert --or--

Column 7, line 32, please delete "litogra-" and insert --lithography--

Column 7, line 33, please delete "phy"

Signed and Sealed this

Twenty-fourth Day of May, 1988

Attest:

DONALD J. QUIGG

Attesting Officer

Commissioner of Patents and Trademarks